(12) United States Patent
Estakhri (10) Patent No.: US 6,957,295 B1
(45) Date of Patent: Oct. 18, 2005

(54) FILE MANAGEMENT OF ONE-TIME-PROGRAMMABLE NONVOLATILE MEMORY DEVICES

(75) Inventor: Petro Estakhri, Pleasanton, CA (US)

(73) Assignee: Lexar Media, Inc., Fremont, CA (US)

( * ) Notice: Subject to any disclaimer, the term of this patent is extended or adjusted under 35 U.S.C. 154(b) by 87 days.

(21) Appl. No.: 10/054,451

(22) Filed: Jan. 18, 2002

(51) Int. Cl.⁷ .............................................. G06F 12/00
(52) U.S. Cl. ................. 711/103; 711/161; 365/185.11; 714/710
(58) Field of Search ................ 711/103, 161; 365/185.11; 714/710

(56) References Cited

U.S. PATENT DOCUMENTS

| | | | |
|---|---|---|---|
| 4,099,069 A | 7/1978 | Cricchi et al. | |
| 4,130,900 A | 12/1978 | Watanabe | |
| 4,210,959 A | 7/1980 | Wozniak | 364/200 |
| 4,309,627 A | 1/1982 | Tabata | |
| 4,355,376 A | 10/1982 | Gould | 365/230 |
| 4,398,248 A | 8/1983 | Hsia et al. | |
| 4,405,952 A | 9/1983 | Slakmon | 360/49 |
| 4,414,627 A | 11/1983 | Nakamura | |

(Continued)

FOREIGN PATENT DOCUMENTS

| | | | |
|---|---|---|---|
| AU | 0 557 723 | 1/1987 | G11C/5/00 |
| EP | 0 220 718 A2 | 5/1987 | G06F/15/40 |
| EP | 0 243 503 A1 | 11/1987 | G11B/20/10 |
| EP | 0 392 895 A2 | 10/1990 | |
| EP | 0 424 191 A2 | 4/1991 | G06F/11/00 |
| EP | 0 489 204 A1 | 6/1992 | G11C/16/06 |
| EP | 0 522 780 B1 | 1/1993 | |
| EP | 0 522 780 A2 | 1/1993 | |

(Continued)

OTHER PUBLICATIONS

Mendel Rosenblum and John K. Ousterhout, The Design and Implementation of a Log–Structure File System, article, 1991, 15 pgs., Berkely, USA.

Brian Dipert and Makkus Levy. Designing with Flash Memory, book, Apr. 1994, 445 pgs., Annabooks, San Diego, USA.

Science Forum, Inc., Flash Memory Symposium 95, symposium, 1995, 13 pgs.; Honga Bunkyo–ku Tokyo.

Ross. S. Finlayson and David R. Cheriton, An Extended File Service Exploiting Writes–Once Storage, article., 1987, 10 pgs. ACM.

Jason Gait, The Optical File Cabinet: A Random–Access File System for Write–Once Optical Disks, article, Jun. 1988, 12 pgs., Beaverton, Oregon.

Henry G. Baker, Memory Management, book, 1995, 19 pgs., Springer–Verlag Berlin Heidelberg, Germany.

Sape J. Mullender and Andrew S. Tanenbaum, A Distributed File Service Based on Optimisitc Concurrency Compl. article. 1985, 12 pgs., ACM.

(Continued)

Primary Examiner—Mano Padmanabhan
Assistant Examiner—Mehdi Namazi
(74) Attorney, Agent, or Firm—Law Offices of Imam (57) ABSTRACT

An embodiment of the present invention includes a digital equipment system comprising a host for sending commands to read or write files having sectors of information, each sector having and being modifyable on a bit-by-bit, byte-by-byte or word-by-word basis. The host being operative to receive responses to the commands. The digital equipment further including a controller device responsive to the commands and including one-time-programmable nonvolatile memory for storing information organized into sectors, based on commands received from the host, and upon commands from the host to re-write a sector, the controller device for re-writing said sector on a bit-by-byte or word-for-word basis.

11 Claims, 4 Drawing Sheets

| 0 1 2 ........15 | 16 | 17 ............1025 | 1026 | |
|---|---|---|---|---|
| Data | Defect | Data | Defect | Data |

U.S. PATENT DOCUMENTS

| | | |
|---|---|---|
| 4,450,559 A | 5/1984 | Bond et al. .................... 371/10 |
| 4,456,971 A | 6/1984 | Fukuda et al. ............... 364/900 |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez .................... 364/900 |
| 4,525,839 A | 6/1985 | Nozawa et al. ............... 371/38 |
| 4,532,590 A | 7/1985 | Wallach et al. |
| 4,609,833 A | 9/1986 | Guterman |
| 4,616,311 A | 10/1986 | Sato .......................... 364/200 |
| 4,654,847 A | 3/1987 | Dutton ........................ 371/10 |
| 4,710,871 A | 12/1987 | Belknap et al. ............. 364/200 |
| 4,746,998 A | 5/1988 | Robinson et al. .......... 360/72.1 |
| 4,748,320 A | 5/1988 | Yorimoto et al. ........... 235/492 |
| 4,757,474 A | 7/1988 | Fukushi et al. ............. 365/189 |
| 4,774,700 A | 9/1988 | Satoh et al. .................. 369/54 |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima ......................... 364/900 |
| 4,829,169 A | 5/1989 | Watanabe |
| 4,843,224 A | 6/1989 | Ohta et al. |
| 4,896,262 A | 1/1990 | Wayama et al. ............ 364/200 |
| 4,914,529 A | 4/1990 | Bonke ......................... 360/48 |
| 4,920,518 A | 4/1990 | Nakamura et al. .......... 365/228 |
| 4,924,331 A | 5/1990 | Robinson et al. .......... 360/72.1 |
| 4,943,745 A | 7/1990 | Watanabe et al. |
| 4,953,122 A | 8/1990 | Williams .................... 364/900 |
| 4,970,642 A | 11/1990 | Yamamura |
| 4,970,727 A | 11/1990 | Miyawaki et al. |
| 5,070,474 A | 12/1991 | Tuma et al. ................ 395/500 |
| 5,093,785 A | 3/1992 | Iijima |
| 5,168,465 A | 12/1992 | Harari ........................ 257/320 |
| 5,198,380 A | 3/1993 | Harari .......................... 437/43 |
| 5,200,959 A | 4/1993 | Gross et al. ................ 371/21.6 |
| 5,218,695 A | 6/1993 | Noveck et al. |
| 5,220,518 A | 6/1993 | Haq |
| 5,226,168 A | 7/1993 | Kobayashi et al. ......... 395/800 |
| 5,227,714 A | 7/1993 | Lou |
| 5,253,351 A | 10/1993 | Yamamoto et al. |
| 5,267,218 A | 11/1993 | Elbert |
| 5,268,318 A | 12/1993 | Harari .......................... 437/43 |
| 5,268,870 A | 12/1993 | Harari ........................ 365/218 |
| 5,270,979 A | 12/1993 | Harari et al. ............... 365/218 |
| 5,293,560 A | 3/1994 | Harari ........................ 365/185 |
| 5,297,148 A | 3/1994 | Harari et al. ............... 371/10.2 |
| 5,303,198 A | 4/1994 | Adachi et al. |
| 5,305,276 A | 4/1994 | Uenoyama |
| 5,305,278 A | 4/1994 | Inoue |
| 5,315,541 A | 5/1994 | Harari et al. .................. 365/63 |
| 5,315,558 A | 5/1994 | Hag |
| 5,329,491 A | 7/1994 | Brown et al. |
| 5,337,275 A | 8/1994 | Garner .................... 365/189.01 |
| 5,341,330 A | 8/1994 | Wells et al. |
| 5,341,339 A | 8/1994 | Wells |
| 5,341,341 A | 8/1994 | Fukazo |
| 5,353,256 A | 10/1994 | Fandrich et al. ........ 365/230.03 |
| 5,357,475 A | 10/1994 | Hasbun et al. .............. 365/218 |
| 5,359,569 A | 10/1994 | Fujita et al. |
| 5,365,127 A | 11/1994 | Manley |
| 5,369,615 A | 11/1994 | Harari et al. ............... 365/218 |
| 5,371,702 A | 12/1994 | Nakai et al. |
| 5,381,539 A | 1/1995 | Yanai et al. |
| 5,382,839 A | 1/1995 | Shinohara |
| 5,384,743 A | 1/1995 | Rouy |
| 5,388,083 A | 2/1995 | Assar et al. |
| 5,396,468 A | 3/1995 | Harari et al. ............... 365/218 |
| 5,404,485 A | 4/1995 | Ban |
| 5,406,527 A | 4/1995 | Honma |
| 5,418,752 A | 5/1995 | Harari et al. |
| 5,422,842 A | 6/1995 | Cernea et al. .............. 365/185 |
| 5,422,856 A | 6/1995 | Sasaki et al. |
| 5,428,621 A | 6/1995 | Mehrotra et al. .......... 371/21.4 |
| 5,430,662 A | 7/1995 | Ahonen |
| 5,430,859 A | 7/1995 | Norman et al. ............. 395/425 |
| 5,431,330 A | 7/1995 | Wieres |
| 5,434,825 A | 7/1995 | Harari ........................ 365/185 |
| 5,438,573 A | 8/1995 | Mangan et al. ............. 371/10.3 |
| 5,465,235 A | 11/1995 | Miyamoto |
| 5,465,338 A | 11/1995 | Clay |
| 5,471,478 A | 11/1995 | Mangan et al. ............. 371/10.3 |
| 5,473,765 A | 12/1995 | Gibbons et al. |
| 5,479,638 A | 12/1995 | Assar et al. |
| 5,485,595 A | 1/1996 | Assar et al. ................. 395/430 |
| 5,490,117 A | 2/1996 | Oda et al. |
| 5,495,442 A | 2/1996 | Cernea et al. ......... 365/185.03 |
| 5,504,760 A | 4/1996 | Harari et al. ............... 371/40.1 |
| 5,508,971 A | 4/1996 | Cernea et al. ......... 365/185.23 |
| 5,513,138 A | 4/1996 | Manabe et al. |
| 5,515,333 A | 5/1996 | Fujita et al. |
| 5,519,847 A | 5/1996 | Fandrich et al. |
| 5,523,980 A | 6/1996 | Sakui et al. |
| 5,524,230 A | 6/1996 | Sakaue et al. |
| 5,530,673 A | 6/1996 | Tobita et al. |
| 5,530,828 A | 6/1996 | Kaki et al. |
| 5,530,938 A | 6/1996 | Akasaka et al. |
| 5,532,962 A | 7/1996 | Auclair et al. .............. 365/201 |
| 5,532,964 A | 7/1996 | Cernea et al. ......... 365/189.09 |
| 5,534,456 A | 7/1996 | Yuan et al. .................... 437/43 |
| 5,535,328 A | 7/1996 | Harari et al. ........... 395/182.05 |
| 5,541,551 A | 7/1996 | Brehner et al. |
| 5,544,118 A | 8/1996 | Harari ........................ 365/218 |
| 5,544,355 A | 8/1996 | Chaudhuri et al. |
| 5,544,356 A | 8/1996 | Robinson et al. ........... 395/600 |
| 5,552,698 A | 9/1996 | Tai et al. |
| 5,554,553 A | 9/1996 | Harari .......................... 437/43 |
| 5,563,825 A | 10/1996 | Cernea et al. .......... 365/185.18 |
| 5,566,314 A | 10/1996 | DeMarco et al. ........... 395/430 |
| 5,568,439 A | 10/1996 | Harari ........................ 365/218 |
| 5,572,465 A | 11/1996 | Bashir |
| 5,579,502 A | 11/1996 | Konishi et al. |
| 5,581,723 A | 12/1996 | Hasbun et al. |
| 5,583,812 A | 12/1996 | Harari .................... 365/185.33 |
| 5,592,415 A | 1/1997 | Kato et al. |
| 5,592,420 A | 1/1997 | Cernea et al. .......... 365/185.18 |
| 5,598,370 A | 1/1997 | Niijima et al. |
| 5,602,987 A | 2/1997 | Harari et al. |
| 5,603,001 A | 2/1997 | Sukegawa et al. |
| 5,611,067 A | 3/1997 | Okamoto et al. |
| 5,640,528 A | 6/1997 | Harney et al. |
| 5,642,312 A | 6/1997 | Harari .................... 365/185.33 |
| 5,648,929 A | 7/1997 | Miyamoto |
| 5,663,901 A | 9/1997 | Wallace et al. ................ 365/52 |
| 5,693,570 A | 12/1997 | Cernea et al. ............... 437/205 |
| 5,712,819 A | 1/1998 | Harari .................... 365/185.29 |
| 5,719,808 A | 2/1998 | Harari et al. ........... 365/185.33 |
| 5,723,990 A | 3/1998 | Roohparvar |
| 5,734,567 A | 3/1998 | Griffiths et al. |
| 5,745,418 A | 4/1998 | Ma et al. |
| 5,754,567 A | 5/1998 | Norman |
| 5,757,712 A | 5/1998 | Nagel et al. |
| 5,758,100 A | 5/1998 | Odisho |
| 5,761,117 A | 6/1998 | Uchino et al. |
| 5,768,190 A | 6/1998 | Tanaka et al. |
| 5,768,195 A | 6/1998 | Nakamura et al. |
| 5,773,901 A | 6/1998 | Kantner |
| 5,778,418 A | 7/1998 | Auclair et al. .............. 711/101 |
| 5,781,478 A | 7/1998 | Takeuchi et al. |
| 5,787,445 A | 7/1998 | Daberko |
| 5,787,484 A | 7/1998 | Norman |
| RE35,881 E | 8/1998 | Barrett et al. |

| Patent No. | Date | Inventor |
|---|---|---|
| 5,799,168 A | 8/1998 | Ban |
| 5,802,551 A | 9/1998 | Komatsu et al. |
| 5,809,515 A | 9/1998 | Kaki et al. |
| 5,809,558 A | 9/1998 | Matthews et al. |
| 5,809,560 A | 9/1998 | Schneider |
| 5,818,781 A | 10/1998 | Estakhri et al. |
| 5,822,245 A | 10/1998 | Gupta et al. |
| 5,822,252 A | 10/1998 | Lee et al. |
| 5,822,781 A | 10/1998 | Wells et al. |
| 5,831,929 A | 11/1998 | Manning |
| 5,835,935 A | 11/1998 | Estakhri et al. |
| 5,845,313 A | 12/1998 | Estakhri et al. |
| 5,847,552 A | 12/1998 | Brown |
| 5,860,083 A | 1/1999 | Sukeawa |
| 5,860,124 A | 1/1999 | Matthews et al. |
| 5,862,099 A | 1/1999 | Tobia et al. |
| 5,890,192 A | 3/1999 | Lee et al. |
| 5,901,086 A | 5/1999 | Wang et al. |
| 5,907,856 A | 5/1999 | Estakhri et al. |
| 5,909,586 A | 6/1999 | Anderson |
| 5,920,884 A | 7/1999 | Jennings, III et al. |
| 5,928,370 A | 7/1999 | Asnaashari |
| 5,930,815 A | 7/1999 | Estakhri et al. |
| 5,933,368 A | 8/1999 | Ma et al. |
| 5,933,846 A | 8/1999 | Endo |
| 5,936,971 A | 8/1999 | Harari et al. |
| 5,937,425 A | 8/1999 | Ban |
| 5,953,737 A | 9/1999 | Estakhri et al. |
| 5,956,473 A | 9/1999 | Ma et al. |
| 5,959,926 A | 9/1999 | Jones et al. |
| 5,966,727 A | 10/1999 | Nishino et al. |
| 5,986,933 A | 11/1999 | Takeuchi et al. |
| 5,987,563 A | 11/1999 | Itoh et al. |
| 5,987,573 A | 11/1999 | Hiraka |
| 5,991,849 A | 11/1999 | Yamada et al. |
| 6,011,322 A | 1/2000 | Stumfall et al. |
| 6,011,323 A | 1/2000 | Camp |
| 6,021,408 A | 2/2000 | Ledain et al. |
| 6,026,020 A | 2/2000 | Matsubara et al. |
| 6,026,027 A | 2/2000 | Terrell, II et al. |
| 6,034,897 A | 3/2000 | Estakhri et al. |
| 6,035,357 A | 3/2000 | Sakaki |
| 6,040,997 A | 3/2000 | Estakhri |
| 6,047,352 A | 4/2000 | Lakhani et al. |
| 6,055,184 A | 4/2000 | Acharya et al. |
| 6,055,188 A | 4/2000 | Takeuchi et al. |
| 6,072,796 A | 6/2000 | Christensen et al. |
| 6,081,447 A | 6/2000 | Lofgren et al. |
| 6,081,878 A | 6/2000 | Estakhri et al. |
| 6,097,666 A | 8/2000 | Sakui et al. |
| 6,115,785 A | 9/2000 | Estakhri et al. |
| 6,122,195 A | 9/2000 | Estakhri et al. |
| 6,125,424 A | 9/2000 | Komatsu et al. |
| 6,125,435 A | 9/2000 | Estakhri et al. |
| 6,128,695 A | 10/2000 | Estakhri et al. |
| 6,134,145 A | 10/2000 | Wong |
| 6,134,151 A | 10/2000 | Estakhri et al. |
| 6,141,249 A | 10/2000 | Estakhri et al. |
| 6,145,051 A | 11/2000 | Estakhri et al. |
| 6,151,247 A | 11/2000 | Estakhri et al. |
| 6,173,362 B1 | 1/2001 | Yoda |
| 6,181,118 B1 | 1/2001 | Meehan et al. |
| 6,182,162 B1 | 1/2001 | Estakhri et al. |
| 6,202,138 B1 | 3/2001 | Estakhri et al. |
| 6,223,308 B1 | 4/2001 | Estakhri et al. |
| 6,226,708 B1 | 5/2001 | McGoldrick et al. |
| 6,230,234 B1 | 5/2001 | Estakhri et al. |
| 6,262,918 B1 | 7/2001 | Estakhri et al. |
| 6,272,610 B1 | 8/2001 | Katayama et al. |
| 6,279,069 B1 | 8/2001 | Robinson et al. |
| 6,279,114 B1 | 8/2001 | Toombs et al. |
| 6,374,337 B1 | 4/2002 | Estakhri |
| 6,393,513 B2 | 5/2002 | Estakhri et al. |
| 6,397,314 B1 | 5/2002 | Estakhri et al. |
| 6,411,546 B1 | 6/2002 | Estakhri et al. |
| 6,426,893 B1 * | 7/2002 | Conley et al. ......... 365/185.11 |
| 2003/0033471 A1 | 2/2003 | Lin et al. |

FOREIGN PATENT DOCUMENTS

| | | | |
|---|---|---|---|
| EP | 0 544 252 A2 | 6/1993 | ........... G11C/16/06 |
| EP | 0 613 151 A2 | 8/1994 | |
| EP | 0 617 363 A2 | 9/1994 | |
| EP | 0 619 541 A2 | 10/1994 | |
| EP | 0 663 636 A1 | 7/1995 | |
| EP | 0 686 976 A2 | 12/1995 | ........... G11C/16/06 |
| FR | 93 01908 | 8/1993 | ........... G06F/12/02 |
| JP | 3-228377 | 10/1981 | |
| JP | 59-45695 A | 7/1982 | ........... G11C/17/00 |
| JP | 58-215794 A | 12/1983 | ........... G11C/17/00 |
| JP | 58-215795 A | 12/1983 | ........... G11C/17/00 |
| JP | 59-92485 | 5/1984 | |
| JP | 59-162695 A | 9/1984 | ........... G11C/17/00 |
| JP | 60-212900 | 10/1985 | ........... G11C/29/00 |
| JP | 61-96598 A | 5/1986 | ........... G11C/17/00 |
| JP | 62-283495 A | 12/1987 | ........... G11C/17/00 |
| JP | 62-283497 A | 12/1987 | ........... G11C/17/00 |
| JP | 63-183700 A | 7/1988 | ........... G11C/17/00 |
| JP | 1-138694 | 5/1989 | |
| JP | 4-57295 | 2/1992 | |
| JP | 2 251 323 | 7/1992 | |
| JP | 4-254994 | 9/1992 | |
| JP | 4-268284 | 9/1992 | |
| JP | 4-278297 | 10/1992 | |
| JP | 4-332999 A | 11/1992 | ........... G11C/29/00 |
| JP | 5-128877 | 5/1993 | |
| JP | 5-282883 | 10/1993 | |
| JP | 6-4399 | 1/1994 | |
| JP | 6-36578 | 2/1994 | |
| JP | 6-124175 | 5/1994 | |
| JP | 6-124231 | 5/1994 | |
| JP | 6-131889 | 5/1994 | |
| JP | 6-132747 | 5/1994 | |
| JP | 6-149395 | 5/1994 | |
| JP | 6-266596 | 9/1994 | |
| JP | 7-84871 | 3/1995 | |
| JP | 7-93499 | 4/1995 | |
| JP | 7-114499 | 5/1995 | |
| JP | 7-141258 | 6/1995 | |
| JP | 7-235193 | 9/1995 | |
| JP | 7-311708 | 11/1995 | |
| JP | 7-334996 | 12/1995 | |
| JP | 6-18018 | 1/1996 | |
| JP | RM-37697 | 2/1996 | |
| JP | 2 291 990 | 2/1996 | |
| JP | 8-69696 | 3/1996 | |
| JP | 2 304 428 | 3/1997 | |
| JP | 9-147581 | 6/1997 | |
| SU | 1388877 A1 | 4/1988 | |
| SU | 1408439 A1 | 7/1988 | |
| SU | 1515164 A1 | 10/1989 | |
| SU | 1541619 A1 | 2/1990 | |
| SU | 1573458 A2 | 6/1990 | |
| SU | 1686449 A2 | 10/1991 | |
| WO | 84/00628 | 2/1984 | ........... G06F/11/20 |
| WO | WO 94/20906 | 9/1994 | |

OTHER PUBLICATIONS

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers., 2 pgs.

Hiroshi Nakamura, Junichi Miyamoto, Kenichi Imamiya, Yoshihsa Iwata, Yoshihisa Suguira and Hideko Oodaira, A Novel Sensing Scheme with On–Chip Page Copy for Flexible Voltage NAND Flash Memories, article, Jun. 1996, 9 pgs., vol. E76–C. No. 6.

Takaaki Nozaki, Toshiki Tanaka, Yoshiro Kiuya, Eita Kinoshita, Tatsuo Tsuchiya and Yutaka Hayashi, A 1–Mb Eeprom with Monos Memory Cell for Semiconductor Disk Application, article, 1991, 5 pgs., Journal of Solid–State Circuits, vol. 26, No. 4.

Kaihwang and Faye A, Briggs, Computer Architecture and Parallel Processing. book, 194, McGraw–Hill, Inc., 2 pgs., US.

Walter Lahti and Dean McCarron, State of the Art; Magnetic Vs. Optical Store Data in a Flash, article, 1990, 7 pgs., vol. 15, No. 12, McGraw–Hill, Inc., US.

Ron Wilson, Integrated Circuits: 1–Mbit flash memories seek their role in aystene design, article, Mar. 1, 1989, 2 pgs., No. 5, Tutsa, OK.

S. Mehroura, J.H. Yuan, R.A. Cemea, W.Y. Chien, D.C. Guteman, G. Samachisa, R. Noman. M. Mofidi, W.Lee, Y. Fong, A. Mihnea, E. Hann, R.W. Gregory, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs. Mountain View, CA.

Steven H. Leibson, Nonvolatile, in–circuit–reprogrammable memories, article, Jan. 3, 1991.. 12 pgs. EDN, Circle No. 12.

Walter Lahti and Dean McCarron, State of the Art: Magnetic VS. Optical Store Data in a Flash, article, 1990, 7 pgs., vol. 15, No. 12, McGraw–Hill, Inc., US.

Kai Hwang and Faye A. Briggs, Computer Architecture and Parallel Processing, book, 1984, McGraw–Hill, Inc., 2 pgs. US.

Steven H. Leibson, Nonvolatile, In–circuit–reprogammable memories, article, Jan. 3, 1991, 12 pgs., EDN, Circle No. 12.

Ramon Caceres, Fred Douglis, Kai Li and Brian Marsh, Operating System Implications of Solid–State Mobile Computers, article, 7 pgs., Oct. 1993, Workshop on Workstation Operating Systems.

Michael Wu and Wily Zwaenepoel, A Non–Volatile, Main Memory Storage System, 12 pgs., 1994, ADCM, San Jose, CA USA.

Dave Bursky, Innovative flash memories match DRAM densities: available with a choice of features, flash memories are finding homes in many systems (includes related articles on the origins of flash, and on the differeneces between NAND and NOR flash memories), article, May 16, 1994, 9 pgs., Electronic Design, v. 42, n. 10, The Gale Group.

Anthony Cataldo, New flash enhancements up ante. (Intel's 28F400BV–120 and 28F004BV–120, Almel's AT29BV010 and AT29BV020, and Samsurg Semiconductor's KM29V32000 "flash memory" deices)(Product Announcement), article, Mar. 13, 1995, 4 pgs., Electronic News, v.41, n. 2056, The Gale Group.

Sam Weber, "Flash " Modular portability, neusability, small size valued for a host of APPs–Consumer formats flocking to "flash" article, Jul. 22, 1996, 9 pgs. Electronic Engineering Times, n. 99, CMP Media.

Toshiba, Mos Memory (Non–volatile), 1995, Data Book.

Stan Baker, But Integation Calls for Hardware, Software Changes: Flash: designers face the dawn of a new memory age, article, Sep. 12, 2003, 5 pgs.; Electronic Engineering TImes, 1990, N. 619, 41, CMP Media.

Toshiba Toshiba Mos Digital Integrated Circuit Silicon Gate CMOS, (TC58NS512DC) Mar. 21, 2001, 43 pgs., Data Book.

Toshiba Corporation, Smil (Smartmedia Interface Library) Handware Edition Version 1.00, Jul. 1, 2000, 36 pgs., Data Book.

Toshiba, Toshiba Mos Digital Integrated Circuit Silicon Gate, (TC58512FT), Mar. 5, 2001, 43 pgs., Data Book.

Toshiba Toshiba Mos Digital Integrated Circuit Silcon Gate, (TC58DVM92A1FT00), Jan. 10, 2003, 44 pgs., Data Book.

Toshiba, Toshiba Mos Digital Integrated Circuit Silicon Gate, (TC58DVG02A1FT00), Jan. 10, 2003, 44 pgs.; Date Book.

Toshiba, Toshiba Mos Digital Integrated Circuit Silicon Gate, (TH58100FT), Mar. 5, 2001, 43 pgs., Data Book.

35NONvolatile Memory Technology Review, A Time of Change, Proceedings 1993 Conference, Jun. 22–24, 1983, Linthicum Heights, MD USA.

Toshiba Corporation, SMIL (Smartmedia interface Library) Software Edition Version 1.00, Jul. 1, 2000, 135 pgs., Data Book.

Toshiba Mos Memory (Non–Volatile), 1996, 279 pgs., Data Book.

Dan Auclair, Optimal Solid State Disk Architecture for Portable Computers, symposium, Jul. 9, 1991, 7 pgs., SunDisk Corporation.

Book—*Computer Architecture and Parallel Processing*, Kai Hwang & Faye A. Briggs, McGraw–Hill Book Co., © 1984, p. 64.

Magazine—"State of the Art: Magnetic VS. Optical Store Data in a Flash", by Walter Lahti and Dean McCarron, Byte magazine dated Nov. 1, 1990, 311, vol. 15, No. 12.

Magazine—Technology Updates, Integrated Cirrcuits, "Mbit flash memories seek their role in system design", Ron Wilson, Senior Editor, Computer Design magazine 28 (1989) Mar. 1, No. 5, Tulsa OK, US, pp. 30 and 32.

1992 Symposium of VLSI Circuits Digest of Technical Papers, "EEPROM for Solid State Disk Applications", S. Mehoura et al., SunDisk Corporation, Santa Clara, CA. R.W. Gregor et al., AT&T Bell Laboratories, Allentown, PA. pp. 24 and 25.

* cited by examiner

FILE MANAGEMENT OF ONE-TIME-PROGRAMMABLE NONVOLATILE MEMORY DEVICES

BACKGROUND OF THE INVENTION

1. Field of the Invention

The present invention relates generally to methods and apparatus for managing files stored within and read from one-time-programmable nonvolatile memory devices and particularly to manipulating file managers for keeping track of the location of files stored within such one-time-programmable nonvolatile memory devices.

2. Description of the Prior Art

Storage of digital information is continuously enjoying improvement and advancements in terms its rate of performance for storage and retrieval as technology advances. As an example, digital cameras, which have become commonplace in the field of photography employ nonvolatile memory devices (devices requiring erasure of information prior to rewriting of information) for storing and retrieving captured photos of images. Similarly, archival of information is an application for nonvolatile memory devices. More recently, one-time-programmable nonvolatile memory devices have found their way for use by digital cameras and archives.

The problem posed by one-time-programmable nonvolatile memory devices is clearly the inability to re-program them. That is, once an area of memory has been written thereto, it cannot be re-written. This is precisely the reason for their natural use in archival of information. Generally, archived information requires a one-time writing or programming. The same applies to the application of one-time-programmable nonvolatile memory devices to disposable digital films. Upon storage of a number of photos of images, the disposable film is developed and disposed thereof.

The management of information, i.e. digital data, within any of these systems need be performed to maintain track of the location of the stored information. Generally, these systems include a controller device coupled to the one-time-programmable memory and to a host for directing the storage of information to particular areas within the one-time-programmable nonvolatile memory. The actual or user data is generally stored in a location identified for this purpose typically referred to as the file area and information regarding the location of the file area is kept in a separate location referred to as the system area. The file and system areas as both stored in one-time programmable nonvolatile memory. The problem that arises is successful manipulation of the system area to manage the data area. For example, when power is temporarily disconnected and re-established, the controller must know where there is free or available memory to write new information within the one-time-programmable nonvolatile memory and thus must restore information regarding the location of information within the latter.

Thus, the need arises for a system and method for managing or manipulating digital information stored and read from one-time-programmable nonvolatile memory.

SUMMARY OF THE INVENTION

Briefly, an embodiment of the present invention includes a digital equipment system comprising a host for sending commands to read or write files having sectors of information, each sector having and being modifyable on a bit-by-bit, byte-by-byte or word-by-word basis. The host being operative to receive responses to the commands. The digital equipment further including a controller device responsive to the commands and including one-time-programmable nonvolatile memory for storing information organized into sectors, based on commands received from the host, and upon commands from the host to re-write a sector, the controller device for re-writing said sector on a bit-by-bit, byte-by-byte or word-for-word basis.

The foregoing and other objects, features and advantages of the present invention will be apparent from the following detailed description of the preferred embodiments which make reference to several figures of the drawing.

DETAILED DESCRIPTION OF THE PREFERRED EMBODIMENTS

Figure 1:
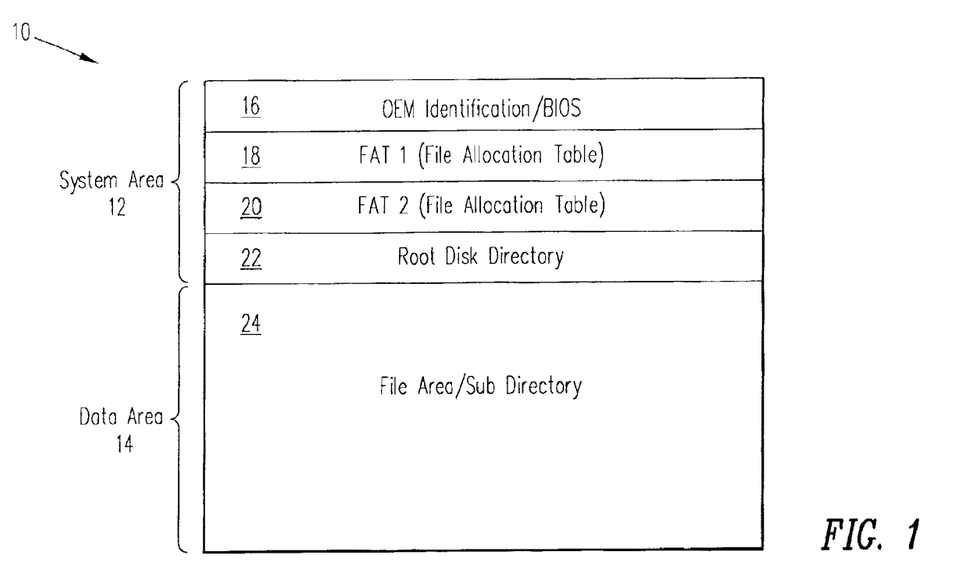
FIG. 1 shows an example of a layout 10 of a file system in accordance with an embodiment of the present invention.

Referring now to FIG. 1, an example of a layout 10 of a file system is shown to include a system area 12 and a data area 14 in accordance with an embodiment of the present invention. The system area 12 is for storing information pertaining to the organization of the information stored or to be stored in the data area 14.

Within the system area 12 is included an area 16 for maintaining the Original Engineering Manufacturer (OEM) identification/Bidirectional Input/Output System (BIOS), an area 18 for maintaining a File Allocation Table (FAT) 1, an area 20 for maintaining a FAT 2, an area 22 for maintaining root disk directory information and an area 24 for maintaining the file area. All of the areas 16–24 are stored within a one-time-programmable memory device. As previously described, such a memory can be programmed only once in any of its given locations and thus cannot be erased and reprogrammed again. The challenged posed, which is resolved by the present invention, is to manipulate the information or data stored within the area 24 by using the information stored within and read from the system area 12.

In one embodiment of the present invention, it is further important to maintain the layout of FIG. 1 in order to ensure backward compatibility of the methods and teachings of the present invention with that of prior art systems, as file system structures generally employ such a layout. In fact, one type of file system, such as a DOS-compatible file system, must follow that of the layout 10 of FIG. 1. Digital equipment, such as digital cameras, uses DOS structure file systems to store digital photos (or files) into storage devices.

In FIG. 1, the FAT1 and 2 each indicate how the file area 24 is allocated. The root disk directory includes a fixed number of directory entries. The file area 24 includes data files (in the case of digital cameras, this is the area in which digital photos are maintained) and subdirectory files and free data sectors available for storage therein. These areas are divided into a block of sectors accessible by a host, discussed in further detail below. In one embodiment of the present invention, these areas are typically of fixed size depending on the capacity of the media. The data in the file area 24 are organized in clusters with each cluster including a predetermined number of sectors, such as 1, 2, 4, 8, 16 or any other integer number of sectors.

Figure 2:
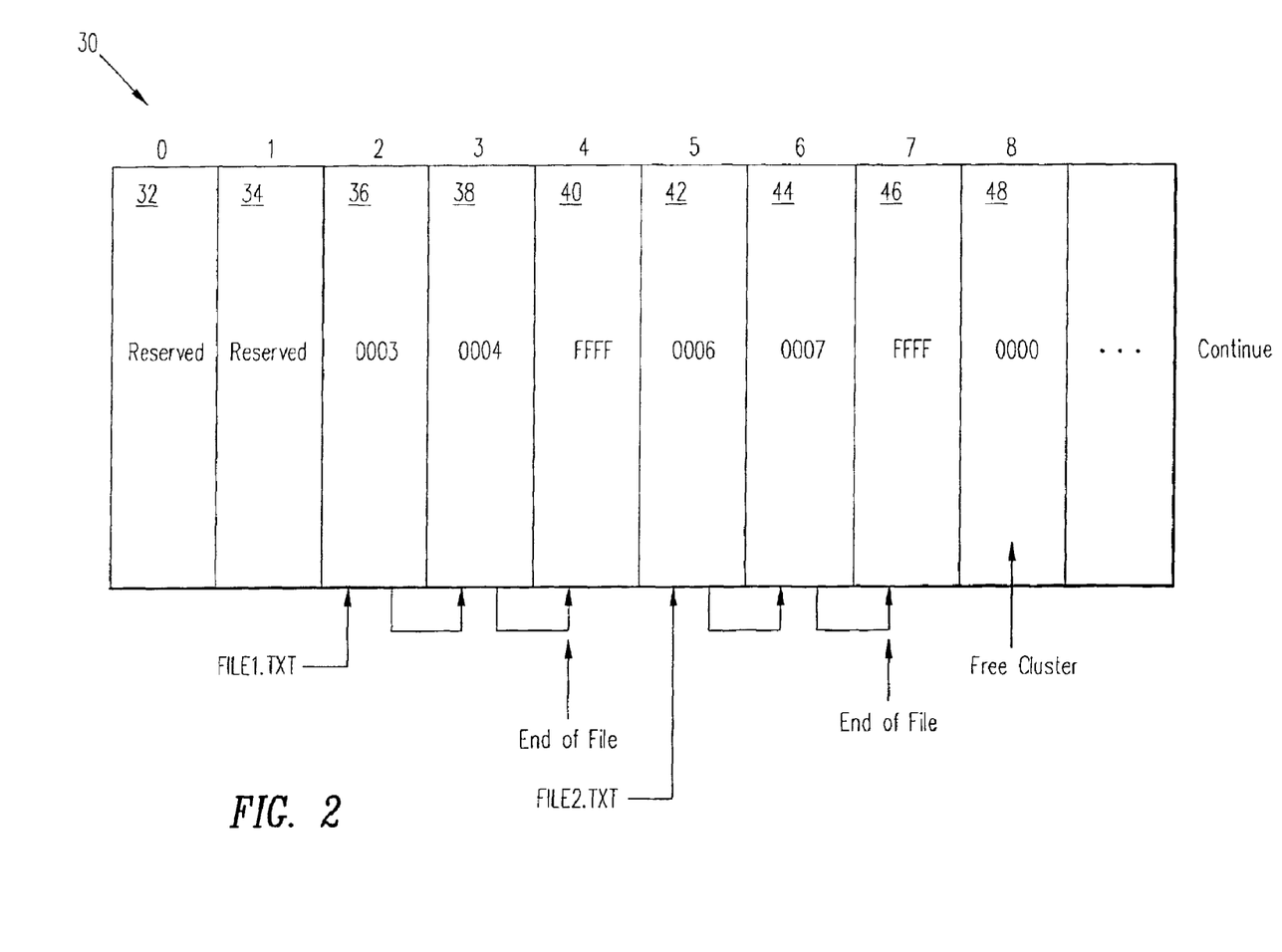
FIG. 2 shows a shows an example of a FAT entry 30.

The FAT 1 and 2 each include one entry per cluster. Within each entry in the FAT, there is stored a link value pointing to the next location within the cluster in which data is located. An example of this is found in FIG. 2. FIG. 2 shows an example of a FAT entry 30 within one of its sectors. Each of the locations 32–48 points to a cluster within the file area 24 of FIG. 1. For example, at location 36, which is the beginning or start-of-file for "File1.txt", the linked value is '0003', which is the location within the FAT entry 30 where the next location of the data within the file area 24 for the file File1.txt is located. At location '0003' or location 38, the link value is '0004' pointing to the next location and so on. The end-of-file for File1.txt is at location 40 where the value "FFFF" appears denoting the end-of-file although any other value can be used to denote the end of file. The beginning or start of the "File2.txt" is at location 42 where the link value is '0006' pointing to the next location within the entry 30 and the '0006' points to '0007', which ultimately points to an end-of-file value for "File2.txt". The value '0000' indicates a free or available cluster.

In one embodiment of the present invention, the identification of the end-of-file is important during power-up. That is, after a power interruption and upon power-up, the system must know where it can store new information such as a digital photograph or file. In doing so, the end-of-file is identified by a flag or a predetermined value, as 'FFFF' and the location following the location in which the end-of-file resides is identified as the location for the start-of-file of a new file to be stored.

In prior art digital cameras used today, since one-time-programmable nonvolatile memory devices are not utilized, rather, nonvolatile memory devices that are erasable for reprogramming are utilized, the size of each file (or picture) is a different size and the media or memory can be easily modified to account for the various picture sizes. Pictures are stored onto the media and the FAT areas are updated at times when pictures (or files) are stored onto the system. Accordingly, a sector, which is a group of storage locations, within a FAT1 or FAT2 is modified more than once when one or more pictures are store onto the media. It should be noted that a sector includes more than one bit and/or byte of information and when a picture is stored, while all of the bits or bytes of the sector may not be modified, prior art methods and techniques nevertheless modify an entire sector of information within memory or the media.

In the present invention however, due to the use of one-time-programmable nonvolatile memory devices, a sector cannot be erased and reprogrammed every time a host updates or modifies the sector, i.e. a picture is store. Thus, the present invention must avoid reprogramming of a sector every time the host updates the same.

This is accomplished by the methods and teachings of the present invention in one of two distinct methods. First, in order for the media to be backward compatible with the present file system, a controller device is utilized to accomplish this task by keeping a correlation between logical addresses and physical addresses and also by maintaining track of defective blocks, a block including one or more sectors of information. Logical addresses are host-generated addresses for identifying sectors to be accessed by the controller. Physical addresses are addresses identifying sectors within the one-time-programmable nonvolatile memory device.

Use of one-time-programmable devices entails a relationship between logical addresses and physical addresses that is one-to-one except for blocks/sectors that are deemed defective. In one embodiment of the present invention, a bit, byte or word, where a byte and word are each one or more bits, is programmed rather than an entire sector when a picture (or file) is stored. Thus, the controller maintains track of all of the sectors that are requested to be written by the host and if the host modifies or updates the file manager sectors, such as FAT1, FAT2 and/or the root directory sectors in the case of a file management system such as DOS, as depicted in FIG. 1 herein, the controller compares the sectors to be programmed (or written) to that which is actually stored in the media and identifies the byte which is modified within the sector to be written and only programs those bits, bytes or words in the media which are modified and reside within the same physical location. This is perhaps best understood with reference to a block diagram.

Figure 3:
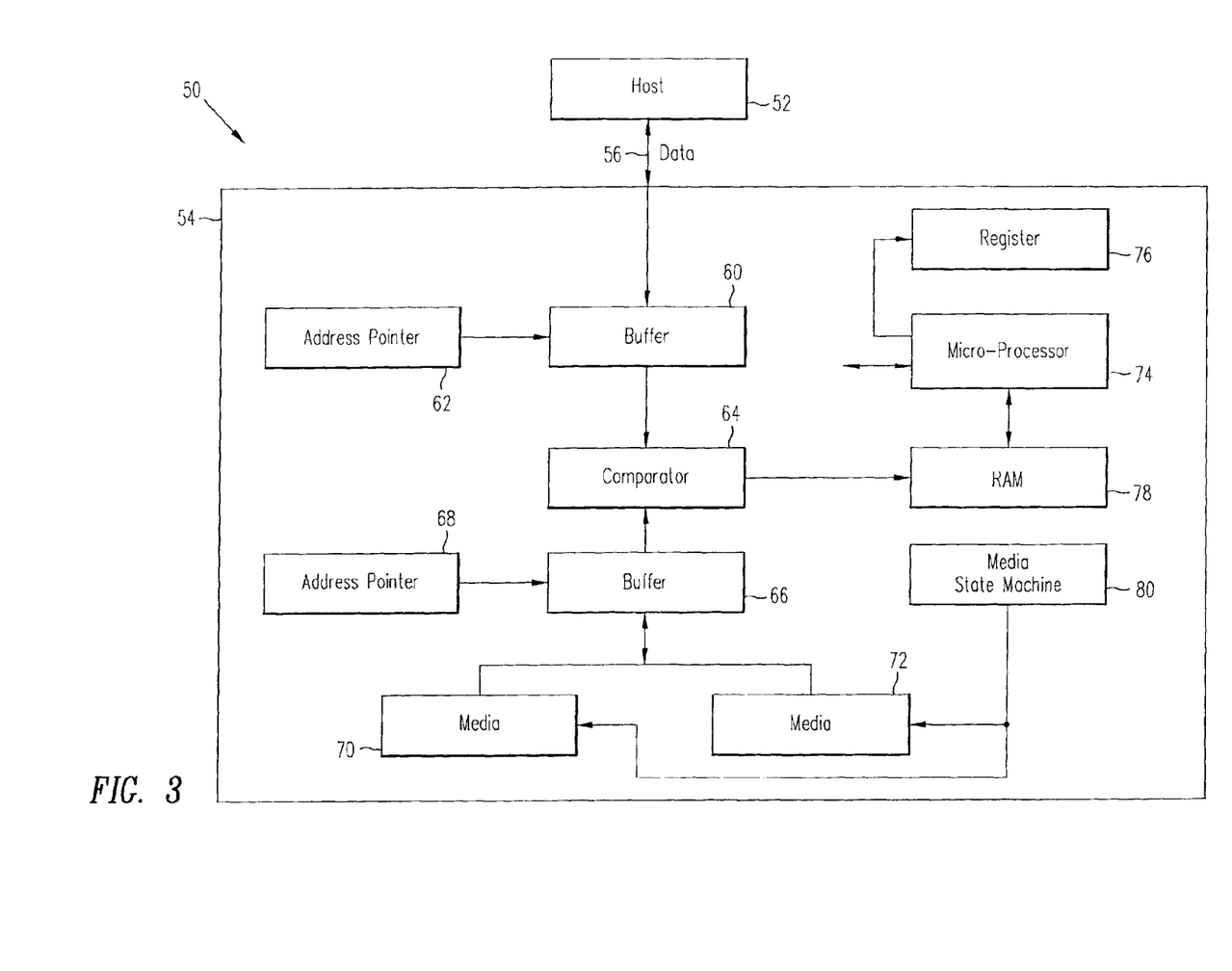
FIG. 3 illustrates a digital equipment system 50 in accordance with an embodiment of the present invention.

Referring now to FIG. 3, a digital equipment system 50 is shown to include a host 52 coupled to a controller device 54 through a data bus 56 in accordance with an embodiment of the present invention. The host 52 commands the controller device 54, via the data bus 56, to store pictures or files within a media or one-time-programmable nonvolatile memory and later may request to read such information again through the data bus 56.

The controller device 54, in FIG. 3, is shown to include a buffer 60, an address pointer 62, a comparator 64, a buffer 66, an address pointer 68, a media device 70 and a media device 72, a microprocessor 74, a register 76, a Random Access Memory (RAM) device 78 and a media state machine 80. The buffer 60 is shown coupled to the comparator 64. Also shown coupled to the comparator 64 is the buffer 66. The address pointer 62 is shown coupled to the buffer 60 and the address pointer 68 is shown coupled to the buffer 66. The buffer is also shown coupled to the media devices 70 and 72. While not shown explicitly in FIG. 3 in the interest of avoiding confusion, the microprocessor 74 executes a program for controlling the blocks depicted within the controller device 54. The program the microprocessor 74 executes resides within the RAM device 78. The media state machine 80, in part, controls the addressing of the media devices 70 and 72. The buffer 66 directs information to be stored and read from the media devices 70 and 72. The latter are one-time-programmable nonvolatile memory devices for storing pictures and/or files depending on the application of the system 50.

In operation, the buffer 60 receives commands from the host 52 to read or program information into the media devices 70 and 72. Each time such an access is commanded by the host to be performed by the controller device 54, certain sectors are identified for such access using the logical addressing discussed hereinabove. Using this sector information or a derivation thereof, which is at some point in time stored in the buffer 60 of FIG. 3, the comparator compares a sector to be modified or accessed by the host with those sectors to which information has been previously written. This is performed by a comparison operation by the comparator 64 between the contents of the buffer 60 and the contents of the buffer 66. In fact, this comparison operation is performed on a bit-by-bit, byte-by-byte or word-by-word basis and only those bits, bytes or words, which need to be modified due to the soon-to-be stored information, are modified. This is referred to as partial programming since only a bit, byte or word is modified rather than an entire sector. The buffer 66 receives its information from the media devices 70 and 72.

It is also possible to keep certain number of spare locations for the system area 12 of FIG. 1 particularly if the partial programming is limited. In this case, these sectors can be mapped to the spare sectors by the controller. Use of spare sectors allows for actual address mapping rather than a one-to-one correspondence between logical and physical addresses as noted above. Also, to allow for backward compatibility with DOS-like file systems, files that are of variable length need be accommodated.

Figure 4:
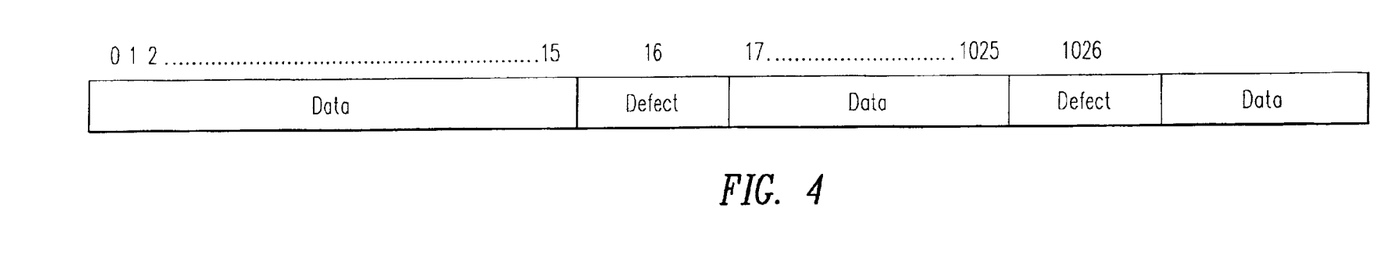
FIG. 4 shows an example of the structure of data including defects pursuant to an embodiment of the present invention.

In other forms of data storage using solid state or non-volatile one-time-programmable devices where a new file manager can be incorporated, the controller/host system nevertheless need to keep track of the addressing and defect blocks and the file locations, such as start and end-of-file and the start of the next file. In one scenario, the defect management can be accomplished in byte or word up to sector or block resolution. If the resolution is small as a byte or word, the controller or host maps the data in a form of a table where those locations that are defective are identified and saved so that they can be skipped over during programming. An example of the structure of data including defects is shown in FIG. 4.

Figure 5:
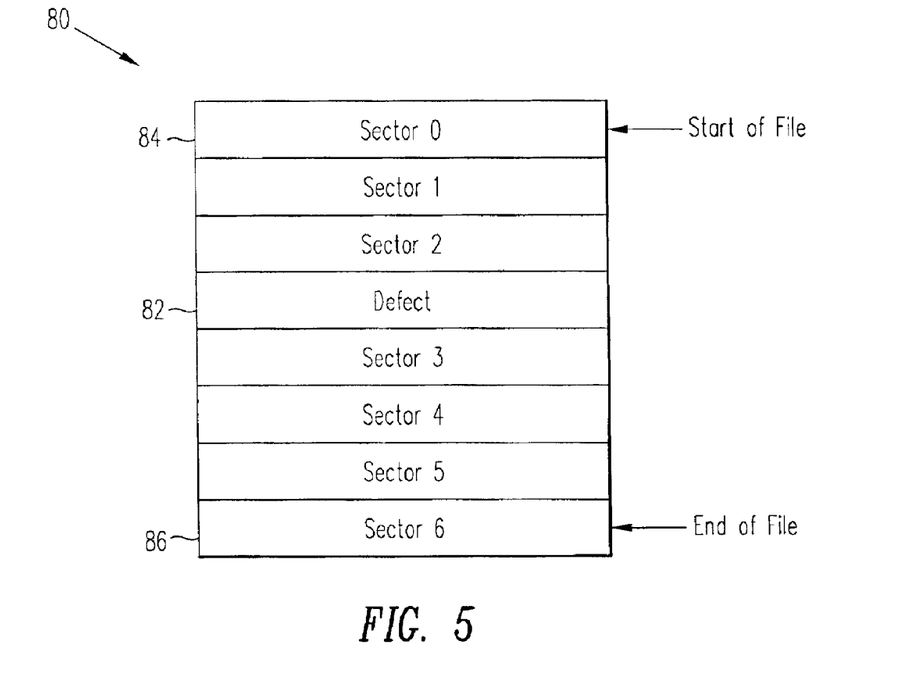
FIG. 5 shows an example of a block structure 80 in accordance with an embodiment of the present invention.

When defect handling is performed, the controller or host map the defective locations into another location that is free of defects. The start and end-of-file are identified in a one-time-programmable media since data is in contiguous format, such as block 0, 1, 2, 3, 4, . . . and saved accordingly. The start and end-of-file are saved and the defective block is skipped by using a simple identifier to identify the defective block, such as a flag or a predetermined value or an address. FIG. 5 shows an example of a block structure 80 including a start-of-file location 84 and an end-of-file location 86 and a defective sector location 82, the latter of which is skipped over when writing to sectors 0–6. The information that was to be written to the defective sector is instead written to a location in a spare area in the system area.

In the case of a one-to-one address relationship, a defective sector/block can point to a spare location where it is replaced by the spare location. This requires that the defective sector/block have enough usable bytes where the location of the redirected sector can be saved. For the purpose of the integrity of the saved address, the controller should employ a unique method to guarantee the value saved in the spare location. This method can be programming the address in the defective sector in multiple locations and when accessed, the locations will be compared to validate the correct address.

An example 100 of another embodiment of the present invention will be explained with reference to FIG. 6. In the event of a power failure, some of the data stored within certain locations of the one-time programmable nonvolatile memory may be corrupted. Upon power restoration, the system needs to recognize the occurrence of a power failure so that a file that includes corrupted data will be identified as an invalid file and following files will be stored at a valid location not adversely affected by power failures.

In order to recognize that a particular sector is corrupt, the system verifies the error correction code (ECC) associated with the particular sector, if the ECC indicates that the particular sector or any portions thereof is corrupt, the next sector is read.

Additionally, the system continues to check for an end-of-file identifier to determine whether or not the file has been properly written and that the ECC error is due to grown error(s) rather than power failure related errors. If there is no start-of-file identifier at a location following the corrupt sector or there is no end-of-file in the rest of the media, such location can be identified as a corrupt sector due to power failure and designated accordingly so as to prevent future storage of information therein.

If the particular sector has been determined to be corrupted, the next sector is read and if all of the data in the next sector is in a non-programmable state, i.e. all 0's or all 1's, and/or the ECC associated with the next sector indicates error, then it is determined that the end-of-file has been reached. Alternatively, to check for end-of-file more thoroughly, the sector following the next sector is read and the same criteria is implemented, i.e. a determination is made as to whether all of the data in the sector is in a non-programmable state and/or the sector-associated ECC indicates an error and based upon the outcome, a determination is made as to whether or not the end-of-file is reached.

Additionally, when there are more than one power failures in a media, there may be more than one corrupted sector and thus the system must verify all locations and where new file locations are started and ended. In other words, the system can maintain a table of corrupted files in a spare area so that after power-up, the system can identify and map the corrupted files thereby preventing their use for future storage.

Figure 6:
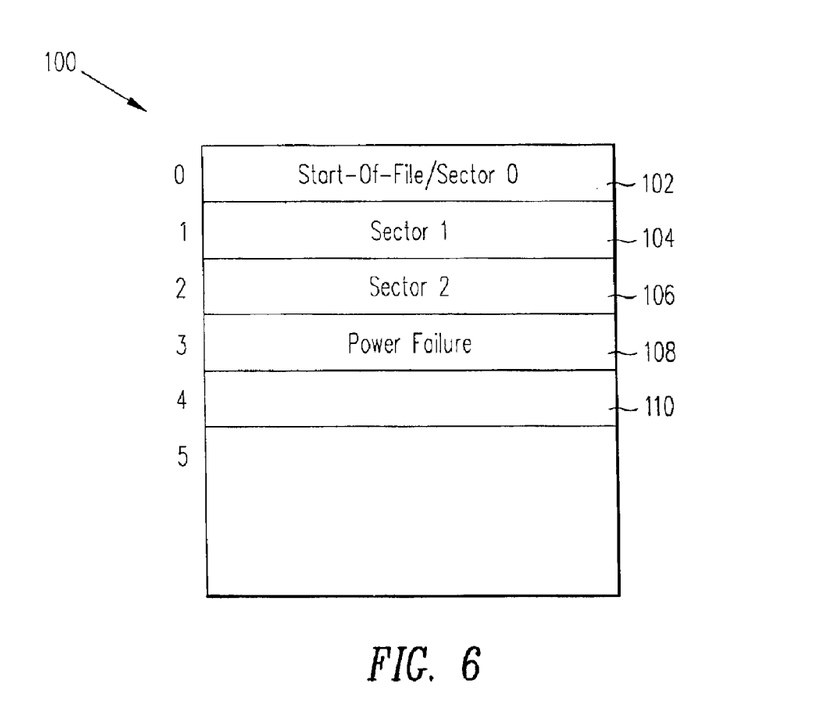
FIG. 6 illustrates an example of another embodiment of the present invention.

Illustratively, in FIG. 6, the start-of-file is designated at sector 0 at 102 and remaining sectors of the file are stored in following sector locations, such as sector 1 104 and sector 2 106. However the next sector location, sector 3 10 has been adversely affected or corrupted by a power failure, thus, a new file will be stored starting from 110.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A digital equipment system comprising:
   a. a host for sending commands to read or write files having sectors of information, each sector having and being modifyable on a bit-by-bit, byte-by-byte or word-by-word basis, said host being operative to receive responses to said commands;
   b. a controller device responsive to said commands, and including,
      one-time-programmable nonvolatile memory for storing information organized into sectors, based on commands received from the host; and
      a comparator coupled to receive sectors to be written and re-written, wherein upon receiving commands from the host to re-write a sector, the comparator comparing a sector to be re-written to a corresponding stored sector allowing the controller device to re-write said sector to be re-written only on a bit-by-bit, byte-by-byte or word-for-word basis and only as to those locations in the sector that have been modified.

2. A digital equipment system as recited in claim 1 wherein said one-time-programmable nonvolatile memory includes a system area and a data area, said system area for storing information pertaining to the organization of the information stored or to be stored in the data area.

3. A digital equipment system as recited in claim 2 wherein said system area includes storage areas for including Original Engineering Manufacturer (OEM) identification/Bidirectional Input/Output System (BIOS), a File Allocation Table (FAT) 1, a FAT 2 and root disk directory information.

4. A digital equipment system as recited in claim 1 wherein said controller device further includes a first buffer for storing a host-provided sector and a second buffer for storing sectors stored or to be stored in the one-time-programmable nonvolatile memory.

5. A digital equipment system as recited in claim 4 further including a comparator coupled between said first and second buffer for comparing a sector to be modified or accessed by the host with those sectors to which information has been previously written.

6. A digital equipment system as recited in claim 1 wherein during power-up, said controller device for identifying the end-of-file, wherein the location following the location in which the end-of-file resides is identified as the location for the start-of-file of a new file to be stored.

7. A digital equipment system as recited in claim 6 wherein said end-of-file is identified by the use of a flag.

8. A digital equipment system as recited in claim 1 wherein said files are digital photographs.

9. A digital equipment system as recited in claim 1 wherein said files are archives.

10. A digital equipment system as recited in claim 1 wherein said controller device maintains a correlation between logical addresses and physical addresses for translating host-provided addresses to addresses recognized by the one-time-programmable nonvolatile memory.

11. A digital equipment system as recited in claim 10 wherein said controller for maintaining track of defective locations within the one-time-programmable nonvolatile memory.

* * * * *